(12) United States Patent
Do

(10) Patent No.: US 7,943,947 B2
(45) Date of Patent: May 17, 2011

(54) LED DEVICE COMPRISING THIN-FILM PHOSPHOR HAVING TWO DIMENSIONAL NANO PERIODIC STRUCTURES

(75) Inventor: Young Rag Do, Seoul (KR)

(73) Assignees: Young Rag Do, Seoul (KR); PSI Co., Ltd., Suwon (KR)

( * ) Notice: Subject to any disclaimer, the term of this patent is extended or adjusted under 35 U.S.C. 154(b) by 637 days.

(21) Appl. No.: 11/658,462

(22) PCT Filed: Jul. 25, 2005

(86) PCT No.: PCT/KR2005/002396
§ 371 (c)(1),
(2), (4) Date: Jun. 18, 2008

(87) PCT Pub. No.: WO2006/011734
PCT Pub. Date: Feb. 2, 2006

(65) Prior Publication Data
US 2008/0258160 A1    Oct. 23, 2008

(51) Int. Cl.
*H01L 33/00* (2010.01)
*H01J 63/04* (2006.01)
(52) U.S. Cl. .......................................... 257/98; 257/99
(58) Field of Classification Search ............ 257/88–103, 257/E33.072
See application file for complete search history.

(56) References Cited

U.S. PATENT DOCUMENTS

| 6,504,180 | B1 | 1/2003 | Heremans et al. |
| 2003/0062530 | A1 | 4/2003 | Okazaki et al. |
| 2005/0072971 | A1* | 4/2005 | Marrocco et al. ............... 257/40 |
| 2006/0049416 | A1* | 3/2006 | Baretz et al. ................... 257/95 |

FOREIGN PATENT DOCUMENTS

WO    WO 97/50132    12/1997

OTHER PUBLICATIONS

International Search Report, dated Nov. 1, 2005, corresponding to PCT/KR2005/002396.

* cited by examiner

*Primary Examiner* — Cuong Q Nguyen
(74) *Attorney, Agent, or Firm* — Christie, Parker & Hale, LLP

(57) ABSTRACT

Disclosed herein is an LED device which comprises a light-emitting diode (LED) and a laminate formed on the LED, the laminate consisting of a substrate and a phosphor thin film laminated on the substrate, wherein the phosphor thin film has a two-dimensional nanoperiodic structure formed in a forward direction of the thin film and has an extinction coefficient of $10^{-3}$ or less. The LED device has higher luminescent efficiency and luminance than conventional LED devices. In addition, since the LED device uses no slurry and a lesser amount of phosphor than conventional LED devices, it is advantageous in terms of optical homogeneity and reduced costs.

17 Claims, 7 Drawing Sheets
(7 of 7 Drawing Sheet(s) Filed in Color)

(a)            (b)

(a)

(b)

(a)

(c)

(b)

(d)

US 7,943,947 B2

LED DEVICE COMPRISING THIN-FILM PHOSPHOR HAVING TWO DIMENSIONAL NANO PERIODIC STRUCTURES

CROSS-REFERENCE TO RELATED APPLICATION

This application is a National Phase Patent Application of International Application Number PCT/KR2005/002396, filed on Jul. 25, 2005, which claims priority of Korean Patent Application Number 10-2004-0057908, filed on Jul. 24, 2004, and Korean Patent Application Number 10-2005-0066844, filed on Jul. 22, 2005.

TECHNICAL FIELD

The present invention relates to a light-emitting diode (LED) device, and more particularly to an LED device with very high luminescent efficiency and very high luminance.

BACKGROUND ART

Since LED devices using InGaN as a nitride semiconductor compound were developed in the mid-1990's, white LED devices have opened a new era of semiconductor illumination. White LED devices are advantageous over incandescent bulbs (e.g., popular 60 W type bulbs) in terms of long service life, small size and driving at low voltage. Based on these advantages, white LED devices have recently been applied to a wide variety of fields, including household fluorescent lamps and full-color displays (LCD backlights).

Conventional methods for fabricating white LED devices utilize three-color LEDs (i.e., red, green and blue LEDs). However, the conventional methods have the problems of high fabrication costs and complicated driving circuits, which increases the size of the final devices. In addition, since the three LEDs have different temperature characteristics, the optical properties and reliability of the final devices may be adversely affected.

Under these circumstances, a method for producing white light by combining a yellow phosphor or a phosphor mixture of a green phosphor with a red phosphor with a 450 nm InGaN-based blue LED has been developed. The principle of white light emission is as follows. First, a portion of blue light emitted from a blue LED excites the phosphor(s) to generate yellowish green fluorescence. Then, the blue light and yellowish green light are combined together to emit white light. FIG. 1 shows a cross-sectional view of a conventional white LED device using a yellow YAG:Ce phosphor powder. As shown in FIG. 1, the white LED device is fabricated by applying the yellow YAG:Ce phosphor powder to an LED. The white LED device has a low color rendering index (CRI), making it difficult to emit white light approximating sunlight, but the device advantageously has a relatively high luminescent efficiency.

For the purpose of increasing the color rendering index of white LED devices, a number of efforts have recently been made to develop white LED devices capable of emitting white light approximating sunlight by using a combination of a UV/violet LED and a three-color (blue, green and red) complex phosphor, instead of a combination of a blue LED and a yellow phosphor. FIG. 2 is a cross-sectional view schematically showing a white LED device using a three-color complex phosphor powder. With reference to FIG. 2, since the three-color complex phosphor is excited by light at 420 nm or shorter from a violet or UV LED to emit white color, the color rendering index of the white LED device is markedly increased. In addition, since the mixing ratio between the phosphors is controlled, there is the advantage that the chromaticity of the white LED device can be easily controlled.

A phosphor excited by a blue or UV/violet LED is essentially required for the fabrication of a white LED device. However, since phosphors used hitherto are powder type, they scatter or absorb large proportions of light from excitation light sources and light generated from the phosphors excited by the sources, causing the problem of low luminance. Further, the phosphor powders must be used in a slurry form in order to apply the phosphors to LEDs. However, phosphor powders in a slurry form disadvantageously have poor physical and chemical homogeneity. Further, some of the phosphors participate in light emission, but some of the phosphors do not due to scattering and screen effects. Moreover, since the amount of the phosphors used is large, considerable production costs are incurred.

On the other hand, when the phosphors are produced into a thin film, physical and chemical homogeneity is improved, adhesion to substrates is superior, gas evolution is minimized, and amount of the phosphors used is reduced. However, since a major portion of light generated from the phosphor thin films is not escaped from the thin films due to total internal reflection or light piping effect, the luminescent efficiency and luminance of the devices are fatally deteriorated. Furthermore, in the case that the crystallinity and transparency of the phosphor thin films are poor, light is additionally lost inside the phosphor thin films other than light loss due to total internal reflection or light piping effect, and thus the luminescent efficiency of the devices is further lowered. For these problems, phosphors in a thin film form have not been used to fabricate LED devices until now.

DISCLOSURE

Technical Problem

Therefore, it is an object of the present invention to provide an LED device comprising a highly physically and chemically homogeneous phosphor thin film and having higher luminescent efficiency and luminance than those of conventional LED devices.

Technical Solution

In accordance with an aspect of the present invention for achieving the above object, there is provided an LED device which comprises a light-emitting diode (LED) and a laminate formed on the LED, the laminate consisting of a substrate and a phosphor thin film laminated on the substrate, wherein the phosphor thin film has a two-dimensional nanoperiodic structure formed in a forward direction of the thin film and has an extinction coefficient of $10^{-3}$ or less.

Advantageous Effects

The LED device of the present invention has higher luminescent efficiency and luminance than conventional LED devices using phosphor powders. In addition, since the LED device of the present invention uses a phosphor with superior homogeneity, it shows improved luminescence homogeneity when compared to the conventional LED devices. Furthermore, since the LED device of the present invention uses no slurry and a lesser amount of phosphor than conventional LED devices, it can be fabricated at reduced costs.

DESCRIPTION OF DRAWINGS

The patent or application file contains at least one drawing executed in color. Copies of this patent or patent application publication with color drawing(s) will be provided by the Office upon request and payment of the necessary fee.

The above and other objects, features and other advantages of the present invention will be more clearly understood from the following detailed description taken in conjunction with the accompanying drawings, in which:

FIG. 1b is a cross-sectional SEM of a quartz substrate having a two-dimensional nanoperiodic structure;

BEST MODE

The present invention will now be described in more detail.

The phosphor thin film used in the LED device of the present invention has a two-dimensional nanoperiodic structure (hereinafter, referred to as a 'two-dimensional nanoperiodic phosphor thin film') in which refractive, scattering and reflective planes are formed so as to be suitable for the extraction of light in the forward direction. The presence of the planes considerably decreases the proportion of excited or generated light lost inside the phosphor thin film and further lowers the extinction coefficient of the phosphor thin film, thus markedly increasing the luminance and luminescent efficiency of the LED device.

Figure 3:
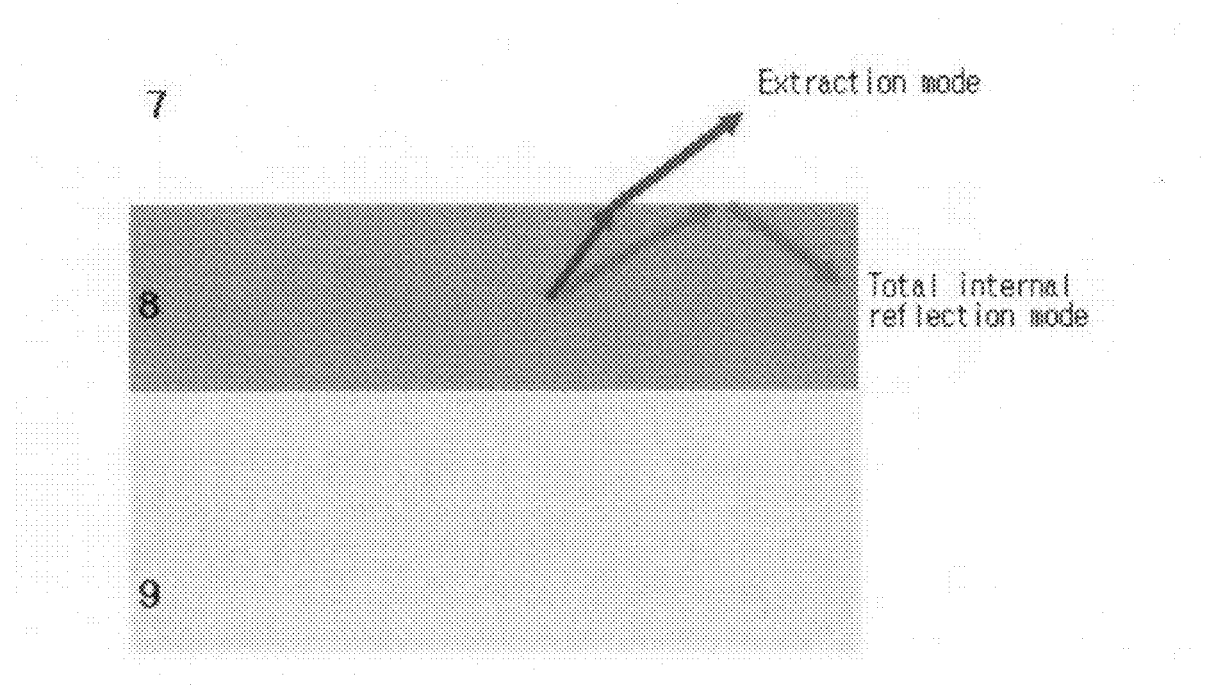
FIG. 3 is a schematic view showing emission paths of light generated from a planar phosphor thin film.

In FIG. 3, there are shown emission paths of light generated from a planar phosphor thin film. Since most phosphor thin films have a high optical refractive index, a major portion of light generated from the phosphor thin film is not escaped from the phosphor thin film due to total internal reflection or light piping effect. As a result, as shown in FIG. 3, a considerable amount of light is totally internally reflected from the interface between the phosphor thin film and air, thus being trapped in the phosphor thin film or absorbed in constituent materials of the phosphor thin film.

To quantitatively explain this phenomenon, principles of classical optics can be applied to calculate the amount of light emitted from a phosphor thin film in the forward direction of an LED device. The following Expression 1 represents a fundamental law known in classical optics, which is established based on the assumption that light escaping from a planar phosphor thin film has a Lambertian distribution and light emitted in the direction of a substrate 9 is not reflected.

$$\eta_{external\ light} = (4n_{phosphor}^2)^{-1} \quad (1)$$

where $\eta_{external\ light}$ is an external light efficiency, and $n_{phosphor}$ is the refractive index of the phosphor.

$\eta_{external\ light}$ represents the amount (%) of light entering air, and is in inverse relationship with the refractive index of the phosphor thin film. Consequently, the luminescent efficiency is greatly decreased with increasing refractive index of the phosphor thin film.

Most phosphor thin films have a refractive index not lower than 1.5, which is the refractive index of glass. For example, ZnS as a representative sulfide phosphor has a refractive index of 2.4, GaN as a nitride phosphor has a refractive index of 2.1, $Y_2O_3$ as an oxide phosphor has a refractive index of 1.8, and a YAG phosphor has a refractive index of 1.817.

The external light efficiency according to the refractive index of some phosphor thin films is calculated by Expression 1, and the results are shown in Table 1 below.

TABLE 1

| Refractive index | 2.5 | 2.4 | 2.3 | 2.2 | 2.1 | 2.0 | 1.9 | 1.8 | 1.7 | 1.6 | 1.5 |
|---|---|---|---|---|---|---|---|---|---|---|---|
| External light efficiency | 4 | 4.3 | 4.7 | 5.2 | 5.7 | 6.3 | 6.9 | 7.7 | 8.7 | 9.8 | 11.1 |

As can be seen from the data shown in Table 1, the amount of light emitted in the forward direction varies in the range of 4% to 11.1% according to the kind of planar phosphor thin films. The remainder of the light is trapped or disappears in the thin films, leading to a low luminescent efficiency.

Specifically, it is known that the amount of light emitted from a planar $Y_2O_3$:Eu phosphor thin film is about 37% of that of an $Y_2O_3$:Eu phosphor powder. Since the planer $Y_2O_3$:Eu phosphor thin film has a refractive index of 1.8, it shows an external light efficiency of about 7.7%, as indicated in Table 1. This implies that only about 7.7% of light generated from the planar phosphor thin film escapes from the phosphor, and the remainder of the light (>90%) is lost due to various factors. Accordingly, there is room for improvement in the luminescent efficiency of the planar phosphor thin film by as much as 10 times. When the luminescent efficiency of the planar phosphor thin film is increased by 3 times or more, the phosphor thin film has a higher luminescent efficiency than the phosphor powder.

It is preferred that the nanoperiodic phosphor thin film used in the present invention has an extinction coefficient of $10^{-3}$ or less. The extinction coefficient is a variable determining the transparency of a phosphor thin film. In addition, the extinction coefficient is associated with the absorbance of a material constituting the phosphor, and may be varied depending on the crystallinity or phase of the phosphor thin film. If the extinction coefficient exceeds $10^{-3}$, the transparency of the phosphor thin film drops and light generated from the thin film is increasingly absorbed by a constituent material of the phosphor thin film. Accordingly, further extinction of the light is undesirably caused, in addition to extinction due to total internal reflection or light piping effect.

The relationship between extinction coefficient and dielectric constant in the present invention can be represented by Expression 2 below:

$$\in = (n+ik)^2 \qquad (2)$$

where $\in$ is a dielectric constant, n is a refractive index, and k is an extinction coefficient.

The amount of light lost in the phosphor thin film is increased as the extinction coefficient of the phosphor thin film increases. In the case where the extinction coefficient is ideally zero, the phosphor thin film is completely transparent. The extinction coefficient can be varied depending on the production conditions of the phosphor thin film. Generally, the extinction coefficient can be varied by the control of post-treatment temperature after formation of the thin film. The post-treatment is not especially restricted, and there may be exemplified rapid thermal annealing. In general, as the annealing temperature increases, the crystallinity is improved and thus the extinction coefficient can be lowered. The annealing temperature is preferably between 500° C. and 800° C. Annealing within this range can control the extinction coefficient of the phosphor thin film to $10^{-3}$ or less. If the annealing is conducted at a temperature exceeding 800° C., the extinction coefficient of the phosphor thin film is not further decreased. Accordingly, too high an annealing temperature is unfavorable.

The nanoperiodic phosphor thin film 10 used in the LED device of the present invention has refractive, scattering and reflective planes suitable for the extraction of light in the forward direction. The presence of the planes allows excited or generated light trapped and lost inside the planar phosphor thin film to emit in the forward direction through Bragg scattering mode. Accordingly, when the phosphor thin film 10 is adhered to the front of an LED, light loss due to total internal reflection or light piping effect is inhibited, enabling the fabrication of an LED device with higher luminance and luminescent efficiency than those of conventional LED devices using phosphor powders.

Figure 4:
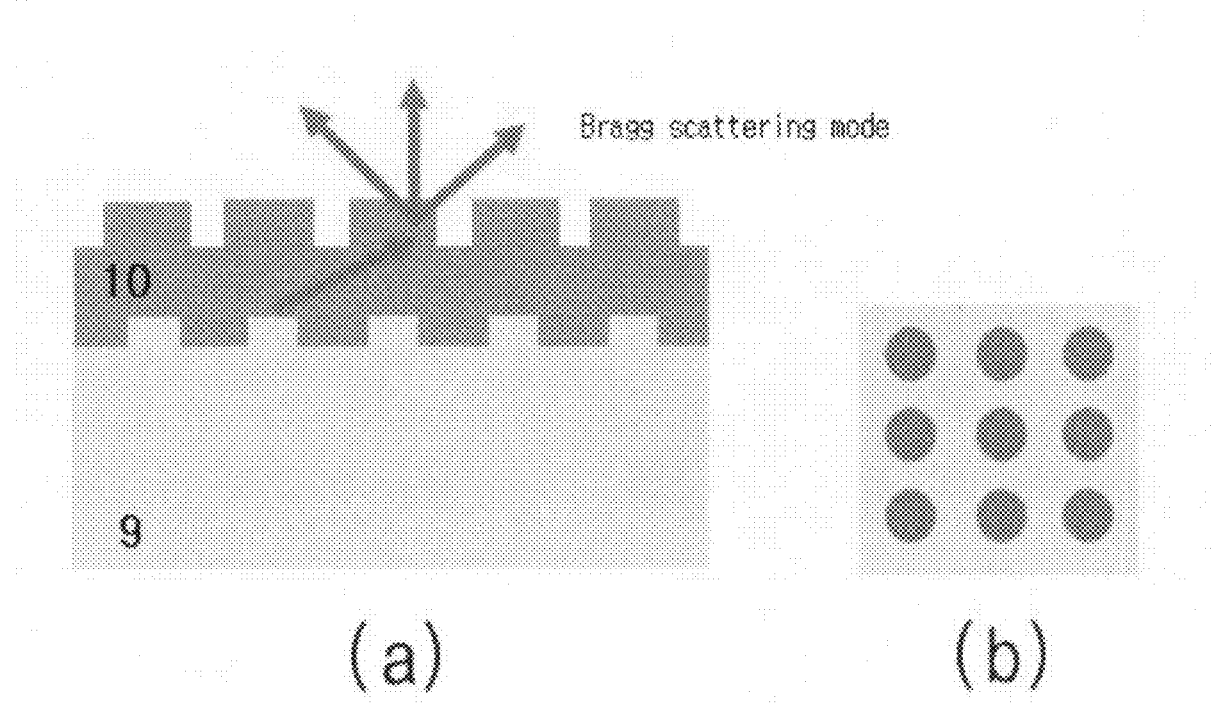
FIG. 4a is a cross-sectional view illustrating the principle of light extraction from a phosphor thin film having a two-dimensional nanoperiodic structure used in the present invention.
FIG. 4b is a top view of a phosphor thin film having a two-dimensional nanoperiodic structure used in the present invention.

FIG. 4*a* illustrates the principle of light extraction from the phosphor thin film 10 used in the present invention in the forward direction, and FIG. 4*b* is a top view of the phosphor thin film 10. With reference to FIGS. 4*a* and 4*b*, light generated inside the nanoperiodic phosphor thin film 10 is strongly Bragg-scattered by the two-dimensional nanoperiodic structure in the visible wavelength range formed at the interface between the phosphor thin film and air, and is extracted in the forward direction. The two-dimensional nanoperiodic structure acts as a kind of grating in the present invention.

In the present invention, the mechanism of light extraction arising from Bragg scattering due to the presence of the two-dimensional nanoperiodic structure depends on the period and height of the nanostructure, rather than the shape of the nanostructure. That is, in the case where the height or period of the nanostructure is in the vicinity of the visible wavelength range, the extraction effects of visible light can be maximized, which indicates that the nanostructure within the visible wavelength range serves as a grating.

In one embodiment of the present invention, the period of the two-dimensional nanoperiodic structure is in the range of 200~5,000 nm, and preferably in the range of 200~1,000 nm. When the period is below 200 nm, light extraction effects due to Bragg scattering are few. On the other hand, when the period is above 5,000 nm, i.e., the period is five times longer than the period of visible light, the nanostructure cannot act as a grating for visible light and thus it is difficult to attain light extraction effects due to Bragg scattering. The fact that light extraction effects due to Bragg scattering depend on the period of the 2-dimensional nanoperiodic structure can be identified by Finite-Difference Time-Domain (FDTD) computer simulation. The FDTD computer simulation is a method for solving the Maxwell equation as a function of time, and is an exact estimation by which the amount of light capable of escaping from the thin-film structure can be accurately calculated. According to the results of the FDTD computer simulation, light extraction effects begin to occur at a period of 200 nm, increase until 500 nm, are saturated at 500 nm or more, gradually decrease around 3,000 nm, and substantially disappear at above 5,000 nm.

On the other hand, the height of the two-dimensional nanoperiodic structure is from 10 nm to 5,000 nm. When the height is lower than 10 nm, light extraction effects due to Bragg scattering are few. Meanwhile, when the height is higher than 5,000 nm, the production of the two-dimensional nanoperiodic structure is difficult and light extraction effects depending on the changes of the height are unfavorably no or few. Changes in the light extraction effects according to the changes in the height of the nanoperiodic structure can be empirically determined by FDTD computer simulation.

The shape of the two-dimensional nanoperiodic structure is not specially limited, and for example, may be spherical, cylindrical, cuboidal, or triangular prismatic which may be an engraved or embossed 3-dimensional structure.

The two-dimensional nanoperiodic structure can be produced by common light exposure, including laser holography. Depending on the kind of a mask used, any 3-dimensional structures, including spheres, cylinders, cuboids and triangular prisms, can be produced.

As viewed from the top of the nanoperiodic phosphor thin film 10 used in the present invention, the surface area ratio between embossed portions and engraved portions is a critical factor, which is indicative showing the production of the two-dimensional nanoperiodic structure. When the surface area ratio of the embossed portions to the engraved portions is in the range of 10~90%, the two-dimensional nanoperiodic structure is optically effective. When the surface area ratio is below 10% or above 90%, the two-dimensional nanoperiodic structure substantially has no nanoperiodicity and cannot serve as a grating for visible light, making it difficult to attain light extraction effects due to Bragg scattering.

According to classical optics, at the interface between a phosphor thin film having no two-dimensional nanoperiodic structure (i.e., planar phosphor thin film) and air, relationships between wave vector $k_{phosphor}$ of light propagating parallel to the surface of the phosphor thin film due to light guiding effects and wave vector $k_{air}$ of light emitted into air, can be represented by Expressions 3a and 3b below:

$$k_{phosphor}(\lambda) = \frac{2\pi n_{phosphor}}{\lambda} \quad (3a)$$

$$k_{air}(\lambda) = \frac{2\pi n_{air}}{\lambda} \quad (3b)$$

where $n_{phosphor}$ is the refractive index of the planar phosphor thin film, $n_{air}$ is the refractive index of air, and $\lambda$ is the wavelength of light.

On the other hand, the relationship between wave vector $k_{eff}$ of light due to wave guiding effects in the nanoperiodic phosphor thin film 10 and Bragg scattering can be expressed by Expressions 4a and 4b below:

$$k_{eff}(\lambda) = \frac{2\pi n_{eff}}{\lambda} \quad (4a)$$

$$k_{air}(\lambda) > \left| k_{eff}(\lambda) \pm m\frac{2\pi i}{\Lambda_x} \pm \frac{2\pi j}{\Lambda_y} \right| \quad (4b)$$

where m and n are each an integer, $\Lambda_x$ and $\Lambda_y$ are the period of the nanoperiodic structure on the x-axis and y-axis, respectively.

From Expressions 4a and 4b, it can be confirmed that the guided light can be extracted into air only when the wave vector of the guided light is smaller than the wave vector of the light emitted into air. To attain this effect, the $n_{eff}$ and $\Lambda$ values should be within proper ranges. The $n_{eff}$ value depends on the planar area ratio of the engraved portions to the embossed portions of the 2-dimensional nanoperiodic structure. It is most preferable that the surface area ratio between the engraved portions and the embossed portions is 1:1. In this case, $n_{eff}$ will have an intermediate value between the refractive index ($n_{air}$) of air and the refractive index ($n_{phosphor}$) of the phosphor thin film.

Figure 5:
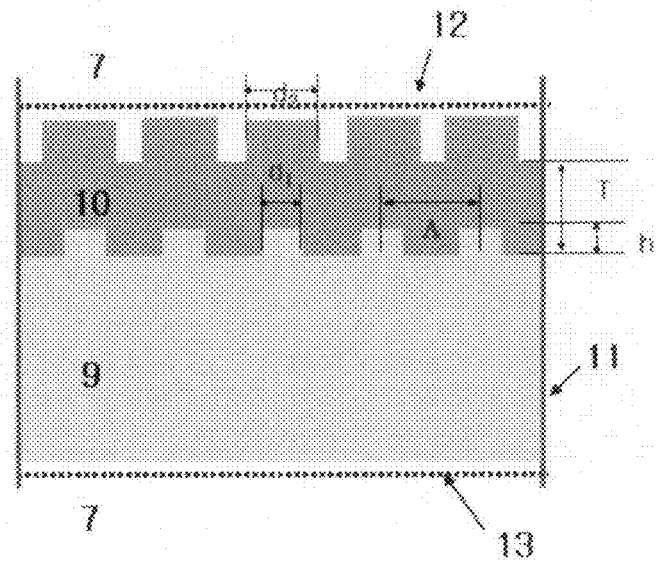
FIG. 5 is a schematic view showing the structure and calculation variables of a phosphor thin film having a two-dimensional nanoperiodic structure for Finite-Difference Time-Domain (FDTD) computer simulation.

In FIG. 5, there is shown schematically a structure for FDTD computer simulation in order to accurately estimate the degree of improvement in the luminescent efficiency due to the two-dimensional nanoperiodic structure.

Referring to FIG. 5, a first detection plane 12 is arranged over the interface between a nanoperiodic phosphor thin film 10 and air, and a second detection plane 13 opposed to the first detection plane 12 is arranged below a substrate 9. The amount of light passing through the two detection planes is calculated on a progressive scale with the passage of time. The dimension of a 3-dimensional structure is restricted to the range that can be calculated within the capacity of a computer, and it is assumed that the structure is surrounded by complete reflectors at four sides, including front, back, left, and right sides. According to the FDTD computer simulation, the amount of light extracted from the nanoperiodic phosphor thin film 10 used in the present invention is calculated, assuming that the amount of light escaping from a planar phosphor thin film and arriving at the detection planes is 1.

As explained earlier, the higher the refractive index of a phosphor thin film, the greater the amount of light trapped in the phosphor thin film. Thus, an $Y_2O_3$ phosphor, which is one of phosphors having a minimum refractive index, was used as a model in the present invention. The refractive index of an $Y_2O_3$:Eu phosphor thin film is 1.8. Particularly, most yellow YAG:Ce phosphors, silicate phosphors and three-color (red, green and blue) complex phosphors that are widely used as phosphors for white LED devices have a higher refractive index than the $Y_2O_3$:Eu phosphor. As mentioned above, the luminescent efficiency of LED devices is decreased as the refractive index of a phosphor increases. For this reason, the necessity for use of the nanoperiodic phosphor thin film 10 in the present invention continually arises.

Hereinafter, a method for fabricating the LED device by applying the nanoperiodic phosphor thin film 10 to the LED 4 or 6 will be described. Examples of the LED device of the present invention include red, blue and green LED devices using a UV LED as an excitation light source and red, blue and green phosphors as respective phosphor thin films, white LED devices using a blue LED device and a YAG phosphor-film or red and green phosphor thin films, and white LED devices using RGB phosphor thin films.

That is, the LED device of the present invention may be a white LED device which comprises an InGaN blue LED having a wavelength band of 420~480 nm and a nanoperiodic phosphor thin film 14 composed of a yellow phosphor exhibiting a luminescence spectrum in the wavelength band of 450~800 nm. Examples of the yellow phosphor are not specially limited so long as they are commonly used in the art, and include YAG:Ce series, Ca-a-SiAlON:Eu series, and $Sr_2SiO_4$:Eu series phosphors.

Alternatively, the LED device of the present invention may be a white LED device which comprises an InGaN blue LED having a wavelength band of 420~480 nm, a nanoperiodic phosphor thin film composed of a green phosphor exhibiting a luminescence spectrum in the wavelength band of 450~650 nm, and a nanoperiodic phosphor thin film composed of a red phosphor exhibiting a luminescence spectrum in the wavelength band of 550~800 nm. The LED device using the complex phosphor has a higher color rendering index than the LED device using the yellow phosphor. The green and red phosphors are not specially limited so long as they are commonly used in the art. For example, the green phosphor may be a $SrGa_2S_4$:Eu series phosphor, and the red phosphor may be a SrS:Eu series or $Sr_2Si_5N_8$:Eu series phosphor.

Alternatively, the LED device of the present invention may be a white LED device which comprises a UV LED having a wavelength band of 350~420 nm, a nanoperiodic phosphor thin film composed of a blue phosphor exhibiting a luminescence spectrum in the wavelength band of 400~600 nm, a nanoperiodic phosphor thin film composed of a green phosphor exhibiting a luminescence spectrum in the wavelength band of 450~650 nm, and a nanoperiodic phosphor thin film composed of a red phosphor exhibiting a luminescence spectrum in the wavelength band of 550~800 nm. The RGB phosphors are not specially limited so long as they are commonly used in the art. For example, the blue phosphor may be a ZnS:Ag series, BAM:Eu series or Holophosphate:Eu series phosphor, the green phosphor may be a ZnS:CuAl series, $Zn_2GeO_4$:Mn series, $LaPO_4$:Eu series or $CeMgAl_{11}O_{19}$:Tb series phosphor, and the red phosphor may be a $Gd_2O_2S$:Eu series or $Y_2O_2S$:Eu series phosphor.

In an alternative embodiment, the LED device of the present invention may be a white LED device which comprises a UV LED having a wavelength band of 350~420 nm and a nanoperiodic phosphor thin film composed of a white phosphor simultaneously emitting both light having a wavelength band of 400~600 nm and light having a wavelength band of 500~700 nm. Examples of the white phosphor are not specially limited so long as they are commonly used in the art, and include $Sr_3MgSi_2O_8$:Eu,Mn series phosphors.

Figure 6:
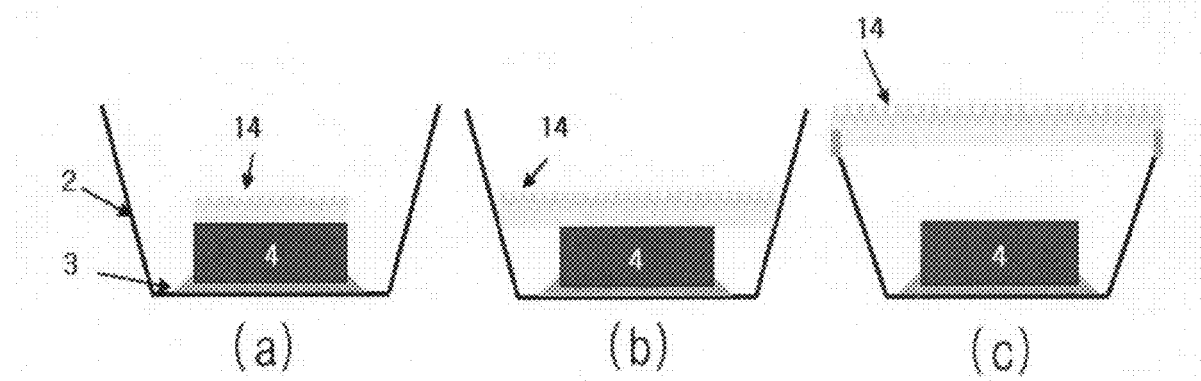
FIGS. 6a to 6c are cross-sectional views of white LED devices wherein a yellow phosphor thin film having a two-dimensional nanoperiodic structure is adhered or applied to a blue LED in accordance with embodiments of the present invention.

The adhesion or application of the laminate 10 of the nanoperiodic phosphor thin film and the substrate (hereinafter, referred to simply as 'laminate') to the LED has a great influence on the light efficiency of the LED device. As shown in FIG. 6a, the laminate may be directly adhered on top of the LED. Also, the laminate may be extended to the reflective planes in order to convert more light in the forward direction, as shown in FIG. 6b. The laminate may also be adhered on a reflector cup, as shown in FIG. 6c. The directly adhered structures shown in FIGS. 6a and 6b show superior luminescent efficiency to the structure shown in FIG. 6c.

The reason is that separation between the LED and the laminate in the structure shown in FIG. 6c brings the LED into direct contact with air, and thus total internal reflection and light piping effects become greater. In contrast, an organic/inorganic binder can be used to adhere the LED to the laminate in the directly adhered structures shown in FIGS. 6a and 6b. In this case, when the refractive index of the binder matches that of the underlying LED, the total internal reflection and light piping effects due to the difference in refractive index disappear. Accordingly, the luminescent efficiency of the LEDs shown in FIGS. 6a and 6b can be improved as compared to that of the structure shown in FIG. 6c where the interface is air. Since blue and violet LEDs that are currently used are made of GaN-based compounds they generally have a refractive index not lower than 2.0. Accordingly, since a considerable amount of light generating from the LED is trapped in the LED, as in the phosphor thin film, it is necessary to match the refractive index of the binder with that of the LED. Any organic/inorganic material that can be used in the art can be used as the binder, but an inorganic binder having a high refractive index is preferably used in the present invention. There is no particular restriction as to the kind of the inorganic binder so long as the inorganic binder is commonly used in the art and shows low absorption of UV light or blue visible light. For example, the adhesion of the laminate to the LED is carried out by coating a $TiO_2$ sol (refractive index: 2.3) or an ITO sol (refractive index: 2.0) on the LED to form a nanometer-scale thin film, laying the laminate on the LED, and mildly sintering the resulting structure at a temperature of 500° C. or lower. Although the ITO sol absorbs a slight amount of UV light, the light absorption is negligible because the thin film is formed on a nanometer scale. Accordingly, no problem associated with the use of the binder takes place.

Advantages of the LED device according to the present invention are that the problems arising from the use of planar phosphor thin films and the problems of light loss that may arise in LEDs can be solved without the need for additional processes. The most important requirement in the structures shown in FIGS. 6a and 6b is that the refractive index of the LED 4 or 6 should be substantially identical to, if possible, that of the substrate on which the phosphor thin film 10 having a 2-dimensional nanoperiodic structure is formed and that of the binder interposed between the LED and the substrate. The difference in the refractive index of the LED, the substrate and the binder is preferably 0.4 or less. Examples of materials for the substrate 9 are not particularly limited so long as they are commonly used in the art. It is preferred that the substrate 9 is a sapphire substrate having a high refractive index (1.76) and capable of withstanding heating temperatures of 500° C. or above in order to lower the extinction coefficient. It is most preferred that the substrate 9 is made of a material having a refractive index equal to or greater than that of the LED and the binder. Accordingly, the refractive index of the binder and the substrate is 1.4 or greater, and it is important that the LED, the binder and the substrate have the same refractive index.

Figure 7:
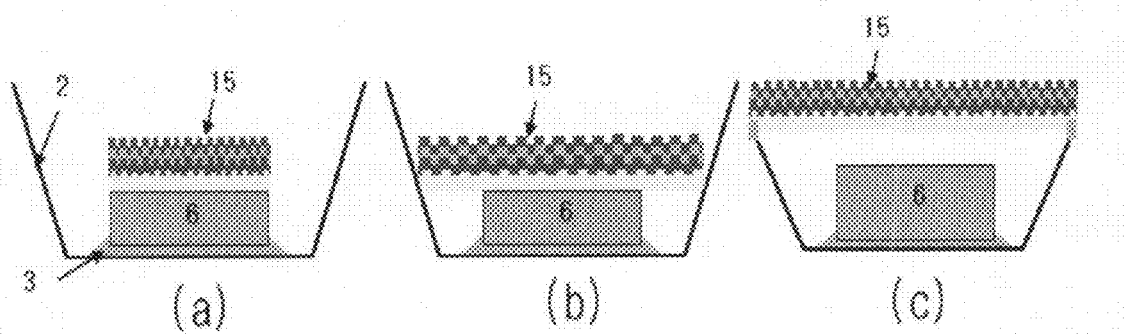
FIGS. 7a to 7c are cross-sectional views of white LED devices wherein a three-color (red, green and blue) phosphor thin film having a two-dimensional nanoperiodic structure is adhered to applied to a UV LED in accordance with embodiments of the present invention.

FIGS. 7a to 7c are cross-sectional views of white LED devices wherein a three-wavelength (red, green and blue (RGB)) phosphor thin film 15 having a two-dimensional nanoperiodic structure is applied to a UV LED. The white LED device of three wavelengths (RGB) can have a high color rendering index by controlling the thickness of constituent color thin films. It is preferred to control the total thickness of the RGB thin films to from about 300 nm to about 1,000 nm. The lamination order of the RGB thin films is not particularly limited. Considering the absorption spectra and luminescence spectra of the respective thin films, it is preferred that the blue phosphor thin film, the green phosphor thin film and the red phosphor thin film are laminated in this order from the bottom. There may be a difference in the refractive index of the respective RGB thin films, but it is preferred that the RGB thin films have the same refractive index. If there is a difference in refractive index, it is preferred in terms of reduced total internal reflection and light piping effects that the lowest thin film has the lowest refractive index and the refractive index is increased with increasing height of the phosphor thin film.

Figure 8:
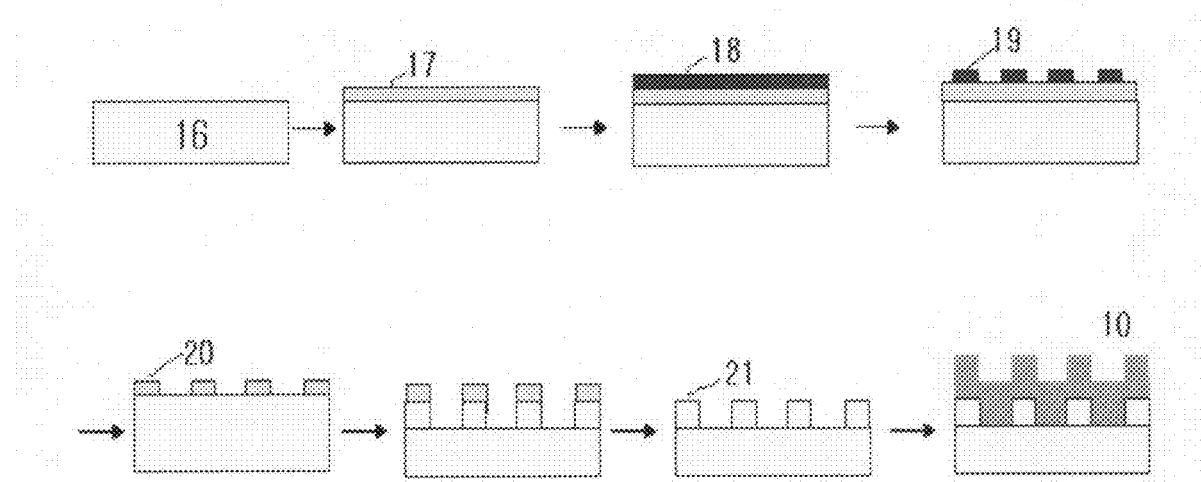
FIG. 8 is a flow chart illustrating the procedure of a method for producing a phosphor thin film having a two-dimensional nanoperiodic structure used in the present invention.

FIG. 8 shows the procedure of a method for producing the phosphor thin film used in the present invention. Hereinafter, the method for producing the phosphor thin film will be explained with reference to FIG. 8.

First, a Si thin film acting as a mask is formed to a thickness of 20~100 nm on a quartz or sapphire substrate 9 by plasma enhanced chemical vapor deposition (PECVD), and then a positive photoresist 18 is spin-coated on the Si thin film.

Next, the photoresist is exposed twice while spinning at 90° by laser interference exposure to form a two-dimensional nanoperiodic pattern. The pattern is developed using a solvent to remove unnecessary portions from the photoresist. Thereafter, the Si mask is dry-etched through the photoresist pattern as a mask to form a two-dimensional nanoperiodic structure. Finally, the substrate is dry-etched using the Si mask having the two-dimensional nanoperiodic structure as a mask to form a two-dimensional nanoperiodic structure on the substrate. If the photoresist is changed to a negative type photoresist, a two-dimensional periodic engraved nanohole structure can be formed. So long as the engraved and the embossed portions have a two-dimensional nanoperiodic structure, they can be used for light extraction. Finally, a phosphor is deposited on the two-dimensional nanoperiodic substrate to produce a two-dimensional nanoperiodic phosphor thin film. In this step, various kinds of phosphor films can be formed on the two-dimensional nanoperiodic substrate by many thin-film formation processes. In the case of a sulfide phosphor thin film, sputtering deposition or atomic layer deposition can be employed to easily produce a two-dimensional phosphor thin film. In the case of an oxide phosphor thin film, laser ablation deposition, e-beam deposition or other deposition can be employed to produce a two-dimensional phosphor thin film. In the case of a nitride phosphor thin film, chemical vapor deposition can be employed to produce a two-dimensional phosphor thin film. When the period of the pattern is 200 nm or more, the period of the nanoperiodic phosphor thin film to be grown on the nanoperiodic pattern is 200 nm or more, regardless of whether the nanoperiodic pattern formed on the substrate is engraved or embossed.

Figure 9:
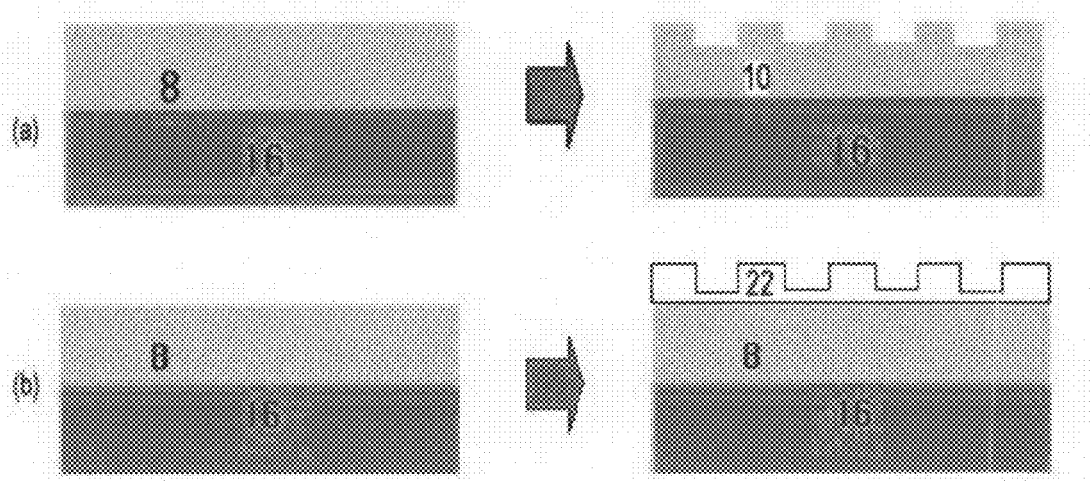
FIG. 9a schematically shows the production of a phosphor thin film having a two-dimensional nanoperiodic structure by etching, and FIG. 9b schematically shows the production of a phosphor thin film on which a two-dimensional nanoperiodic structure made of a material different from that of the phosphor thin film is formed.

Unlike the above-mentioned production method, the bottom of the nanoperiodic phosphor thin film 10 used in the present invention may be planar. In this case, the nanoperiodic phosphor thin film is simply produced by forming a phosphor into a planar thin film and etching the phosphor thin film to form a two-dimensional nanostructure or forming a two-dimensional nanoperiodic structure 22 made of a material different from that of the phosphor thin film on top of the phosphor thin film. The two-dimensional nanoperiodic structure can be controlled so as to cause Bragg scattering. FIG. 9a shows the production of a two-dimensional nanoperiodic phosphor thin film by etching a phosphor thin film, and FIG. 9b shows the production of a phosphor thin film on which a two-dimensional nanoperiodic structure 22 made of a material different from the phosphor is formed. The nanoperiodic phosphor thin film 10 whose lower surface is planar is useful when the refractive index of an underlying substrate is lower than that of the phosphor thin film formed on the substrate. The reason is as follows. In the case that the interface between the bottom of the nanoperiodic phosphor thin film and the substrate is planar and the refractive index of the substrate is lower than that of the nanoperiodic phosphor thin film, light propagating in the back direction (i.e., the direction of the substrate) of the LED device according to the present invention is totally internally reflected due to the difference in the refractive index between the substrate and the nanoperiodic phosphor thin film, and then propagates in the forward direction of the LED device, leading to further improvement in the luminescent efficiency of the LED device. Examples of suitable materials for the two-dimensional nanoperiodic structure 22 are not particularly limited so long as they are transparent to visible light. For example, the two-dimensional nanoperiodic structure 22 can be produced by forming $TIO_2$, ITO or $SiN_x$ into a planar thin film, and wet- or dry-etching the planar thin film using a mask. For effective removal of total internal reflection and light piping effects, it is preferred that a material for the two-dimensional nanoperiodic structure has a higher refractive index than the underlying phosphor thin film. Specifically, the refractive index of the material for the two-dimensional nanoperiodic structure is preferably between 1.8 and 2.5.

MODE FOR INVENTION

The present invention will now be described in more detail with reference to the following preferred examples. However, these examples are not to be construed as limiting the scope of the invention.

Example 1

1-(1): Production of Two-dimensional Nanoperiodic Phosphor Thin Film

First, a Si thin film acting as a mask was formed to a thickness of 20 nm on a 5 mm thick quartz substrate by plasma enhanced chemical vapor deposition (PECVD), and then a positive photoresist (SPR508-A, Shipley) was spin-coated on the Si thin film to form a 90 nm thick photoresist film. Next, the photoresist film was exposed twice while spinning at 90° by interference exposure using a Cd—He laser to form a two-dimensional nanoperiodic pattern. The pattern was developed using as a developing solution (AZ 301, Shipley) to remove unnecessary portions of the photoresist film. Thereafter, the Si mask was etched by dry etching using chlorine gas to form a two-dimensional nanoperiodic Si mask having a period of 200 nm. Then, the quartz substrate was dry-etched using CF gas and the overlying Si mask was removed using chlorine gas to form a two-dimensional nanoperiodic structure on the quartz substrate. The two-dimensional nanoperiodic structure thus formed had a period of 200 nm and a height of 200 nm. Subsequently, an $Y_2O_3$:Eu phosphor thin film was deposited on the two-dimensional nanoperiodic quartz substrate by laser ablation using a 248 nm KrF excimer laser with an energy of 1.3 $J/cm^2$. The phosphor thin film had a deposition thickness of about 800 nm and a height ($h_2$) of about 200 nm. The height ($h_2$) of the two-dimensional nanoperiodic phosphor thin film was identical to the height ($h_1$) of the two-dimensional nanoperiodic quartz substrate. Finally, the phosphor thin film was treated under a nitrogen atmosphere at 500° C. for 2 minutes by rapid thermal annealing.

1-(2) Fabrication of Red LED Device

The substrate on which the two-dimensional nanoperiodic phosphor thin film was laminated was extended to reflective planes and directly adhered to a UV LED having a wavelength band of 350~420 nm to fabricate a red LED device. For the adhesion, an acrylic-based binder having a refractive index of 1.5 was used.

Example 2

A red LED device was fabricated in the same manner as in Example 1, except that a two-dimensional nanoperiodic phosphor thin film having a period of 300 nm was used.

Example 3

A red LED device was fabricated in the same manner as in Example 1, except that a two-dimensional nanoperiodic phosphor thin film having a period of 400 nm was used.

Example 4

A red LED device was fabricated in the same manner as in Example 1, except that a two-dimensional nanoperiodic phosphor thin film having a period of 500 nm was used.

Example 5

A red LED device was fabricated in the same manner as in Example 1, except that a two-dimensional nanoperiodic phosphor thin film having a period of 600 nm was used.

Example 6

A red LED device was fabricated in the same manner as in Example 1, except that a two-dimensional nanoperiodic phosphor thin film having a period of 700 nm was used.

Example 7

A red LED device was fabricated in the same manner as in Example 1, except that annealing was performed at a temperature of 600° C.

Example 8

A red LED device was fabricated in the same manner as in Example 1, except that annealing was performed at a temperature of 700° C.

Comparative Example 1

A red LED device was fabricated in the same manner as in Example 1, except that no two-dimensional nanoperiodic structure was formed on a quartz substrate and no annealing was performed.

Test Example 1

Measurement of Extinction Coefficient

The extinction coefficient was measured using K-MAC model SpectraThick 2000. In each of the phosphor thin film/substrate laminates produced in Example 1, 7 and 8 and Comparative Example 1, the extinction coefficient was measured by analyzing reflection spectra, including interference effects on two beams reflected from the interface between the phosphor thin film and air and between the phosphor thin film and the substrate. The results are shown in Table 2 below.

TABLE 2

| | Example No. | | | |
|---|---|---|---|---|
| | Example 1 | Example 7 | Example 8 | Comparative Example 1 |
| Extinction coefficient | $1.2 \times 10^{-3}$ | $6.8 \times 10^{-3}$ | $9.6 \times 10^{-3}$ | $1 \times 10^{-2}$ |

As can be seen from the data shown in Table 2, the laminate produced in Comparative Example 1 has a very high extinction coefficient of $1 \times 10^{-2}$, whereas the laminates produced in Examples have an extinction coefficient not higher than $1 \times 10^{-3}$, which demonstrates that the amount of light lost by the absorption of light in the phosphor thin films can be markedly decreased.

Test Example 2

FDTD Computer Simulation Test

Figure 10:
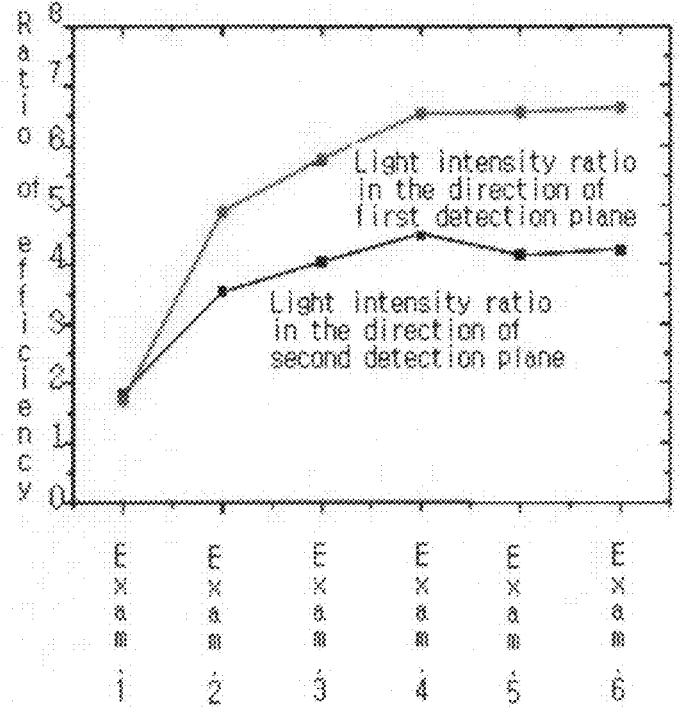
FIG. 10 is a graph showing the intensity ratios of light extracted as a result of FDTD computer simulation according to the period of two-dimensional nanoperiodic structures.

In each of the phosphor thin film/substrate laminates produced in Examples 1 to 6 and Comparative Example 1, the ratio of light extracted in the forward direction of the phosphor thin film (first detection plane) to light extracted in the direction of the substrate (second detection plane) according to the changes in the period of the nanostructures was measured in the same manner as in the FDTD computer simulation of the structure shown in FIG. 5. The measured values were expressed as a multiple, relative to the value obtained in the laminate produced in Comparative Example 1 and shown in FIG. 10. Values on the amount of light emitted in the forward direction are shown in Table 2. Variables for the calculation used herein are as follows:

Height of nanoperiodic structures in substrates ($h_1$): 200 nm

Thickness of nanoperiodic phosphor thin films (T): 800 nm

Period of nanoperiodic structures (Λ): 200, 300, 400, 500, 600, 700 nm

Diameter of nanoperiodic structures in substrates ($d_1$): 0.3 L

Diameter of nanoperiodic structures in nanoperiodic phosphor thin films ($d_2$): 0.6 L Height of nanoperiodic structures in nanoperiodic phosphor thin films ($h_2$): 200 nm

TABLE 3

| | Example No. | | | | | | |
|---|---|---|---|---|---|---|---|
| | Example 1 | Example 2 | Example 3 | Example 4 | Example 5 | Example 6 | Comparative Example 1 |
| Ratio of improvement in efficiency (times) | 1.8 | 4.9 | 5.5 | 6.5 | 6.4 | 6.5 | 1 |

As is evident from Table 3, the luminescent efficiency of the nanoperiodic phosphor thin films used in the present invention was a maximum of 6.5 times higher than that of the nanoperiodic phosphor thin film produced in Comparative Example 1.

Test Example 3

Observation by Electron Microscopy

Figure 11:
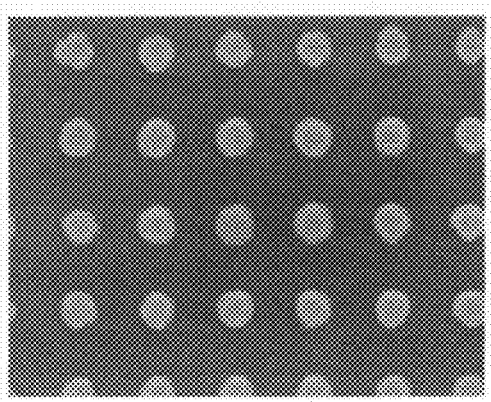
FIG. 11a is a planar scanning electron micrograph (SEM) of a quartz substrate having a two-dimensional nanoperiodic structure.
Figure 11:
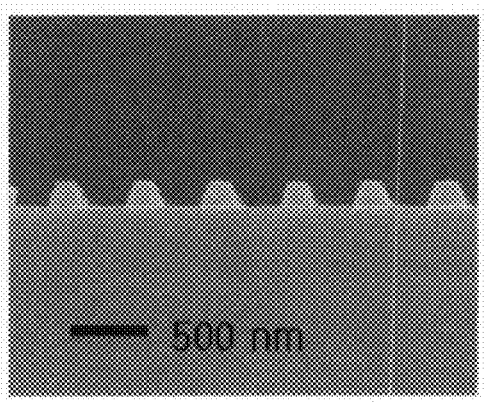
Figure 12:
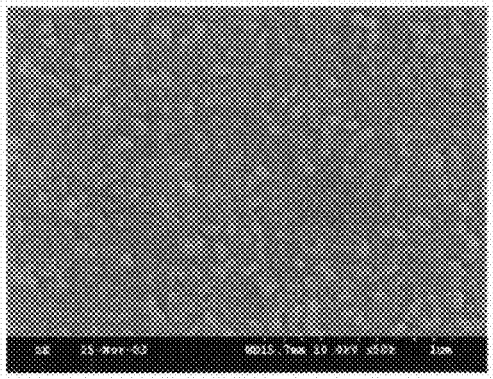
FIG. 12a is a planar SEM of a phosphor thin film produced in Comparative Example 1.
FIG. 12b is a cross-sectional SEM of a phosphor thin film produced in Comparative Example 1.
FIG. 12c is a planar SEM of a phosphor thin film produced in Example 5.
FIG. 12d is a cross-sectional SEM of a phosphor thin film produced in Example 5.
Figure 12:
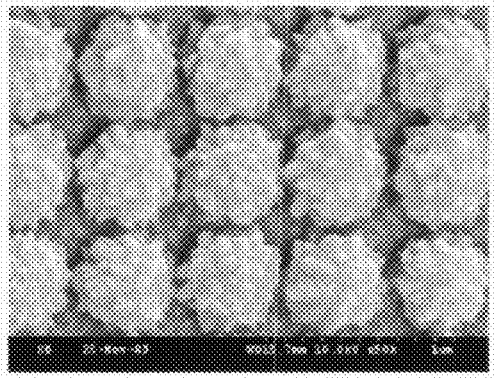
Figure 12:
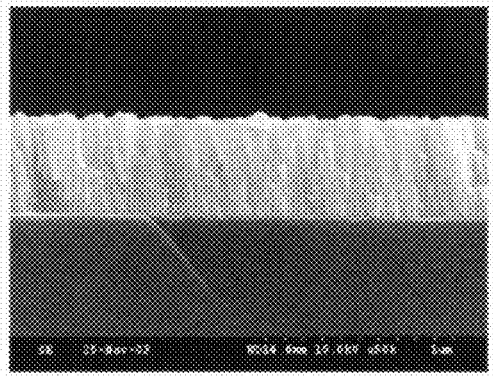
Figure 12:
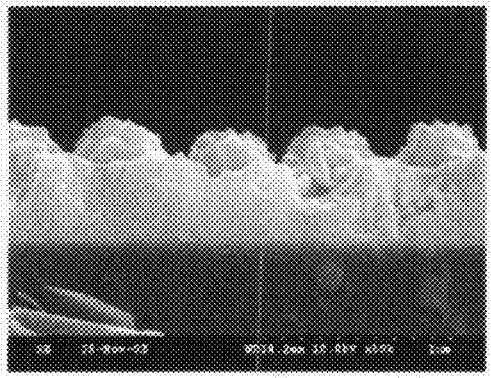

Electron scanning micrographs of the two-dimensional nanoperiodic substrate produced in Example 4 are shown in FIGS. 11a (top) and 11b (side). As apparent from FIGS. 11a and 11b, a highly homogeneous and periodically embossed cylindrical nanostructure is formed on top of the substrate. FIGS. 12a and 12b show a planar SEM and a cross-sectional SEM of the nanoperiodic phosphor thin film produced in Comparative Example 1, respectively. FIGS. 12c and 12d show a planar SEM and a cross-sectional SEM of the nanoperiodic phosphor thin film produced in Example 5, respectively. It can be confirmed from FIGS. 12a to 12d that the two-dimensional nanoperiodic structures are substantially consistent with the structure schematically shown in FIG. 4.

Test Example 4

Measurement of Luminescence Spectrum

Figure 13:
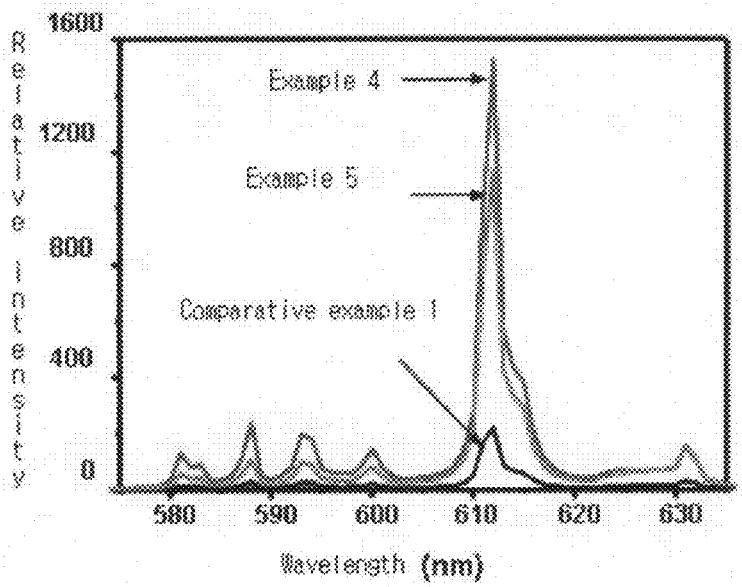
FIG. 13 shows UV-excitation luminescence spectra of phosphor thin films produced in Examples 4 and 5 and Comparative Example 1.

The luminescence spectra of the substrate/phosphor thin film laminates produced in Examples 1 to 6 and Comparative Example 1 were measured using a UV LED (254 nm) as an excitation light source. The luminescent efficiency was tested by measuring the areas under the luminescence spectra of the laminates produced in Examples 1 to 6. The measured values were expressed as a multiple, based on the value obtained in the laminate produced in Comparative Example 1, and the results are shown in Table 3. On the other hand, FIG. 13 shows luminescence spectra of the laminates produced in Examples 4 and 5 and Comparative Example 1. As can be seen from FIG. 13, the luminescent efficiency of the two-dimensional nanoperiodic phosphor thin films was increased by about six times when compared to the planar phosphor thin film. These measured values almost virtually match the theoretical value estimated in the FDTD computer simulation.

TABLE 4

| | Example No. | | | | | | |
|---|---|---|---|---|---|---|---|
| | Example 1 | Example 2 | Example 3 | Example 4 | Example 5 | Example 6 | Comparative Example 1 |
| Ratio of improvement in efficiency (times) | 1.7 | 4.2 | 5.0 | 6.2 | 5.7 | 5.9 | 1 |

Example 9

1-(1): Production of Two-dimensional Nanoperiodic Phosphor Thin Film

An $Y_2O_3$:Ce phosphor thin film was deposited to a thickness of about 5,000 nm on a sapphire substrate having a thickness of 5 mm and a refractive index of 1.76 by laser ablation using a 248 nm KrF excimer laser with an energy of 1.3 $J/cm^2$. Next, a $SiN_x$ thin film having a refractive index of 2.05 was formed to a thickness of 500 nm on the phosphor thin film by PECVD (plasma enhanced chemical vapor deposition). A Si thin film acting as a mask was formed to a thickness of about 20 nm on the phosphor thin film/$SiN_x$ thin film by PECVD. Subsequently, a positive photoresist (SPR508-A, Shipley) was spin-coated on the Si thin film to form a 90 nm thick photoresist film. Then, the photoresist film was exposed twice while spinning at 900 by interference exposure using a Cd—He laser to form a two-dimensional nanoperiodic pattern having a period of 600 nm. The pattern was developed using as a developing solution (AZ 301, Shipley) to remove unnecessary portions of the photoresist film. Thereafter, the Si mask was etched by dry etching using chlorine gas to form a two-dimensional nanoperiodic Si mask having a period of 200 nm. Finally, the $SiN_x$ substrate was dry-etched using $CF_4$ gas and the overlying Si mask was removed using chlorine gas to form a two-dimensional nanoperiodic structure with a period of 600 nm and a height of about 400 nm on the $SiN_x$ substrate, thereby achieving the production of a laminate consisting of the SiNx two-dimensional nanoperiodic structure and the phosphor thin film and the substrate.

1-(2) Fabrication of White LED Device

The laminate consisting of the SiNx two-dimensional nanoperiodic structure and the phosphor thin film and the substrate was extended to reflective planes and directly adhered to a 470 nm blue LED to fabricate a white LED device. For the adhesion, an acrylic-based binder having a refractive index of 1.5 was used.

Comparative Example 2

Figure 1:
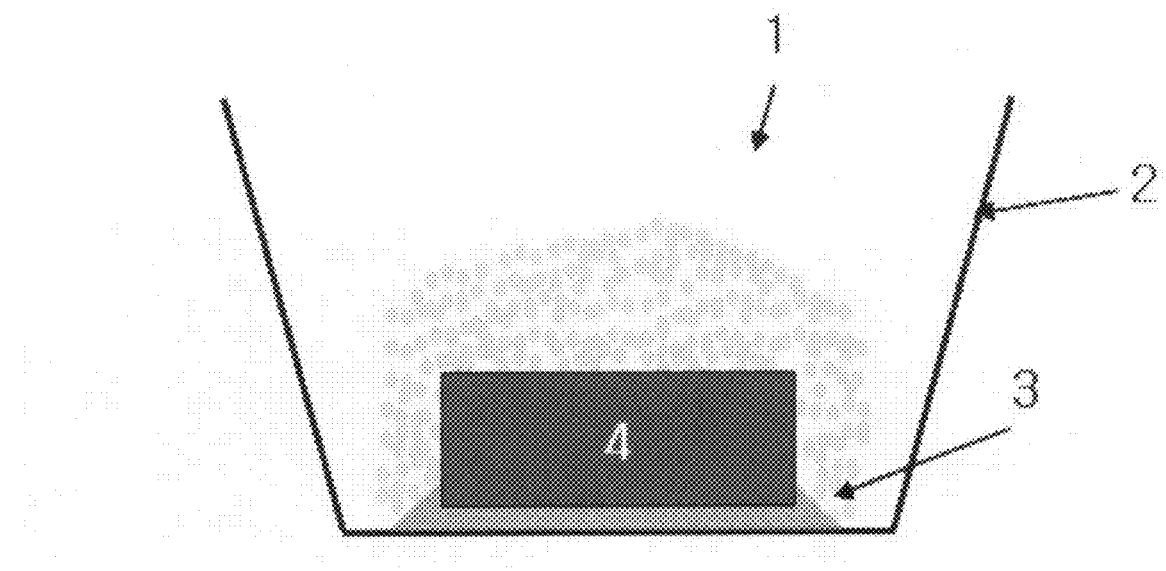
FIG. 1 is a cross-sectional view of a conventional white LED device wherein a YAG:Ce phosphor powder is applied to a blue LED.
Figure 2:
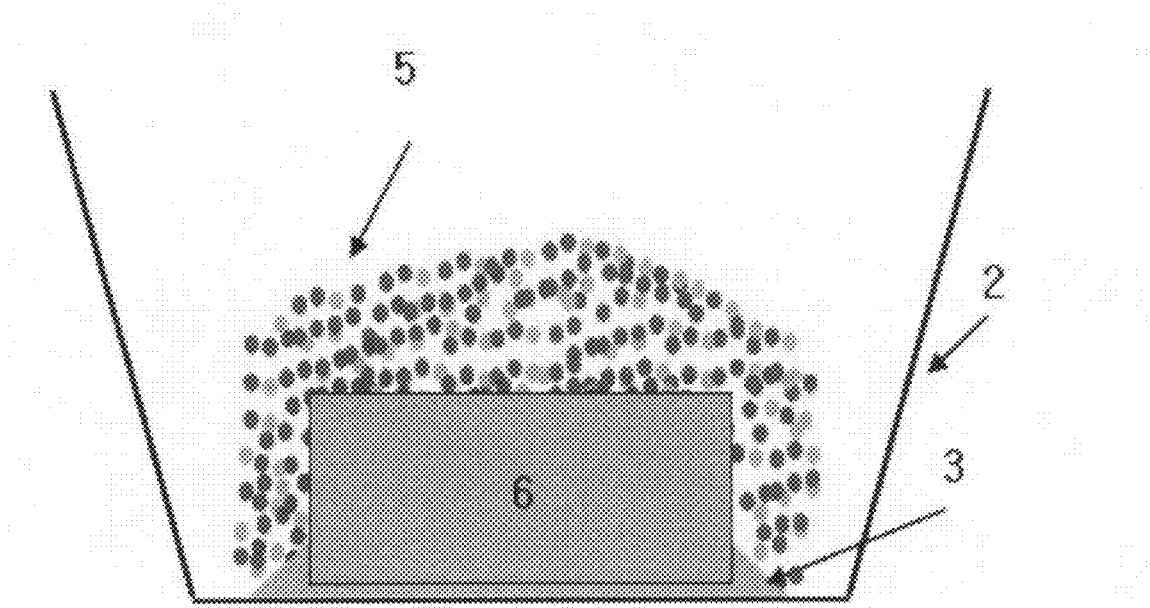
FIG. 2 is a cross-sectional view of a conventional white LED device wherein a three-color (blue, green and red) complex phosphor powder is applied to a violet or UV LED.

A YAG:Ce phosphor powder prepared by solid-state synthesis was dispersed in an acrylic-based binder to obtain a slurry. The slurry was applied on top of a 470 nm blue LED to fabricate the powder type white LED device shown in FIG. 1.

Test Example 5

Figure 14:
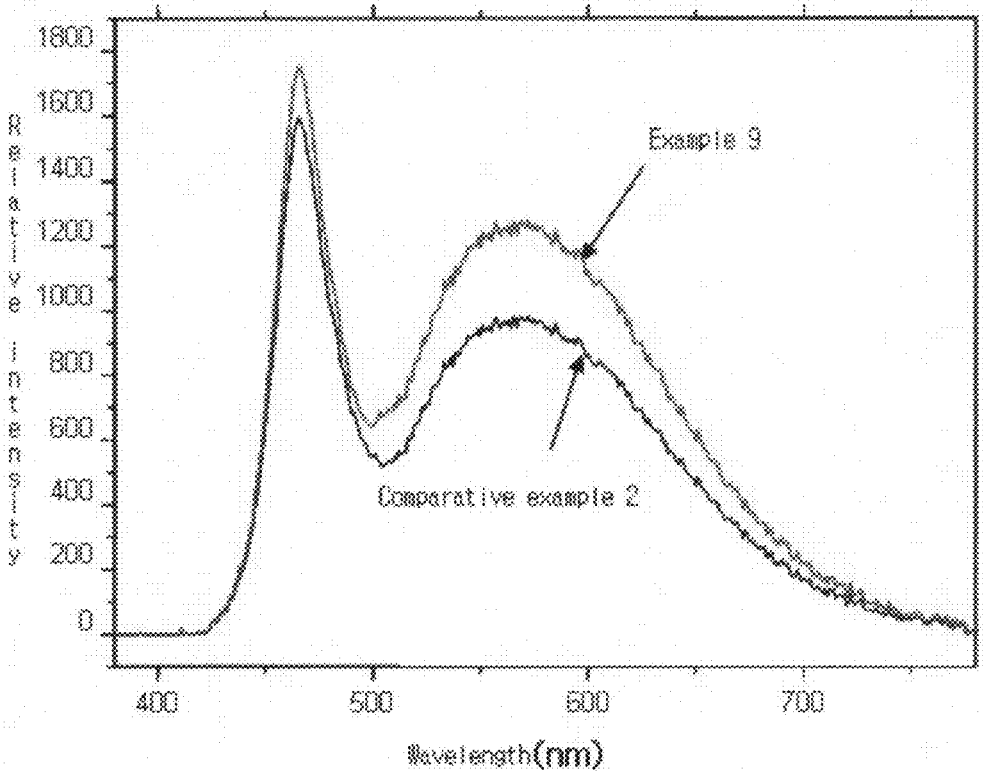
FIG. 14 shows luminescence spectra of white LED devices fabricated in Example 9 and Comparative Example 2.

The luminescent properties of the white LED devices fabricated in Example 9 and Comparative Example 2 were compared at the same driving voltage (3.5V) and current (500 mA). FIG. 14 shows luminescence spectra of the white LED devices. The amount of light emitting from the white LED device fabricated in Example 9 was compared with that of light emitting from the white LED device fabricated in Comparative Example 2. The relative rates are shown in Table 5. As is evident from FIG. 14 and Table 5, the luminescence intensity of the white LED device according to the present invention is higher than that of the white LED device fabricated in Comparative Example 2.

TABLE 5

| Example No. | Relative rate in amount of light emission (%) |
|---|---|
| Example 9 | 130 |
| Comparative Example 2 | 100 |

INDUSTRIAL APPLICABILITY

As apparent from the above description, the LED device of the present invention has higher luminescent efficiency and luminance than conventional LED devices using phosphor powders. In addition, the LED device of the present invention shows superior luminescence homogeneity to the conventional LED devices. Therefore, since the LED device of the present invention improves the problem of low luminance of the conventional LED devices, it can be applied to a wide variety of fields, including household fluorescent lamps and full-color displays (LCD backlights).

The invention claimed is:
1. An LED device, comprising:
a light-emitting diode (LED); and
a laminate formed on the LED, the laminate consisting of a substrate and a phosphor thin film laminated on the substrate,
wherein the phosphor thin film has a two-dimensional nanoperiodic structure formed in a forward direction of the thin film and has an extinction coefficient of $10^{-3}$ or less.
2. The LED device according to claim 1, wherein the two-dimensional nanoperiodic structure has a period of from 200 nm to 5,000 nm.
3. The LED device according to claim 1, wherein the two-dimensional nanoperiodic structure has a height of from 10 nm to 5,000 nm.
4. The LED device according to claim 1, wherein the two-dimensional nanoperiodic structure is engraved or embossed spherical, cylindrical, cuboidal, or triangular prismatic.
5. The LED device according to claim 1, wherein the surface area ratio of the embossed portions to the engraved portions is in the range of 10~90%.

6. The LED device according to claim 1, wherein the phosphor thin film has a planar bottom.

7. The LED device according to claim 1 or 6, wherein the two-dimensional nanoperiodic structure has a refractive index between 1.8 and 2.5, is made of a transparent material having a refractive index identical to or higher than that of the phosphor thin film, and is formed on top of phosphor thin film.

8. The LED device according to claim 1, wherein the LED is an InGaN blue LED having a wavelength band of 420~480 mm, the phosphor thin film is composed of a yellow phosphor exhibiting a luminescence spectrum in the wavelength band of 450~800 nm, and the LED device emits white light.

9. The LED device according to claim 8, wherein the yellow phosphor is a YAG:Ce series, Ca-a-SiAlON:Eu series, or $Sr_2SiO_4$:Eu series phosphor.

10. The LED device according to claim 1, wherein the LED is an InGaN blue LED having a wavelength band of 420~480 nm, the phosphor thin film includes a two-dimensional nanoperiodic thin film composed of a green phosphor exhibiting a luminescence spectrum in the wavelength band of 450~650 nm and a two-dimensional nanoperiodic thin film composed of a red phosphor exhibiting a luminescence spectrum in the wavelength band of 550~800 nm, the two thin films being laminated on each other, and the LED device emits white light.

11. The LED device according to claim 10, wherein the green phosphor is a $SrGa_2S_4$:Eu series phosphor, and the red phosphor is a SrS:Eu series or $Sr_2Si_5N_8$:Eu series phosphor.

12. The LED device according to claim 1, wherein the LED is a UV LED having a wavelength band of 350~420 nm, the phosphor thin film includes a two-dimensional nanoperiodic phosphor thin film composed of a blue phosphor exhibiting a luminescence spectrum in the wavelength band of 400~600 nm, a two-dimensional nanoperiodic phosphor thin film composed of a green phosphor exhibiting a luminescence spectrum in the wavelength band of 450~650 nm, and a two-dimensional nanoperiodic phosphor thin film composed of a red phosphor exhibiting a luminescence spectrum in the wavelength band of 550~800 nm, the three thin films being laminated on each other, and the LED device emits white light.

13. The LED device according to claim 12, wherein the blue phosphor is a ZnS:Ag series, BAM:Eu series or Holophosphate:Eu series phosphor, the green phosphor is a ZnS:CuAl series, $Zn_2GeO_4$:Mn series, $LaPO_4$:Eu series or $CeMgAl_{11}O_{19}$:Tb series phosphor, and the red phosphor is a $Gd_2O_2S$:Eu series or $Y_2O_2S$:Eu series phosphor.

14. The LED device according to claim 1, wherein the LED is a UV LED having a wavelength band of 350~420 nm, the phosphor thin film is a two-dimensional nanoperiodic thin film composed of a white phosphor simultaneously emitting both blue light having a wavelength band of 400~600 nm and light having a wavelength band of 500~700 nm, and the LED device emits white light.

15. The LED device according to claim 14, wherein the white phosphor is a $Sr_3MgSi_2O_8$:Eu,Mn series phosphor.

16. The LED device according to claim 1, further comprising a transparent binder with a refractive index of 1.4 or greater.

17. The LED device according to claim 1, wherein the difference in the refractive index of the LED, the substrate and the two-dimensional nanoperiodic structure is 0.4 or less.

* * * * *

UNITED STATES PATENT AND TRADEMARK OFFICE
CERTIFICATE OF CORRECTION

| | |
|---|---|
| PATENT NO. | : 7,943,947 B2 |
| APPLICATION NO. | : 11/658462 |
| DATED | : May 17, 2011 |
| INVENTOR(S) | : Young Rag Do |

It is certified that error appears in the above-identified patent and that said Letters Patent is hereby corrected as shown below:

On the Title Page

(30) Foreign Application Priority Data

Insert
-- (30) Foreign Application Priority Data
July 24, 2004 (KR) 10-2004-0057908
July 22, 2005 (KR) 10-2005-0066844 --

Page 1 of 1

Signed and Sealed this
Tenth Day of July, 2012

David J. Kappos
*Director of the United States Patent and Trademark Office*